United States Patent [19]  [11] Patent Number: 4,849,248
Hashimoto  [45] Date of Patent: Jul. 18, 1989

[54] ION IMPLANTATION METHOD FOR MAKING SILICON-RICH SILICON DIOXIDE FILM

[75] Inventor: Masashi Hashimoto, Miho, Japan

[73] Assignee: Texas Instruments Incorporated, Dallas, Tex.

[21] Appl. No.: 935,483

[22] Filed: Nov. 26, 1986

[30] Foreign Application Priority Data

Dec. 2, 1985 [JP] Japan .................. 60-272163

[51] Int. Cl.$^4$ .......................................... B05D 5/12
[52] U.S. Cl. .................................. 427/38; 437/250; 437/918
[58] Field of Search ....... 148/1.5, DIG. 76, DIG. 82, 148/DIG. 83; 357/91; 427/38; 250/492.21, 492.3; 437/250, 910

[56] References Cited

U.S. PATENT DOCUMENTS

| | | | |
|---|---|---|---|
| 4,081,292 | 3/1978 | Aoki et al. | 148/1.5 |
| 4,162,176 | 7/1979 | Tsuda | 148/1.5 |
| 4,197,144 | 4/1980 | Kirkpatrick et al. | 148/1.5 |
| 4,466,839 | 8/1984 | Dathe et al. | 148/1.5 |
| 4,642,881 | 2/1987 | Matsukawa | 437/26 |

FOREIGN PATENT DOCUMENTS 120549 6/1985 Japan .

Primary Examiner—Norman Morgenstern
Assistant Examiner—Margaret Burke
Attorney, Agent, or Firm—William E. Hiller; Melvin Sharp; N. Rhys Merrett

[57] ABSTRACT

A silicon dioxide film containing additional silicon in the form of segregates having controlled grain sizs is fabricated by forming a silicon dioxide, injecting silicon ions into the silicon dioxide film by ion implantation with a predetermined ion acceleration energy and a predetermined ion dose, and annealing the resultant silicon dioxide film for causing the additional silicon atoms in the silicon dioxide film to segregate therein to form segregates of silicon having grain sizes which are substantially predominated by the predetermined ion acceleration energy and the predetermined ion dose.

1 Claim, 19 Drawing Sheets

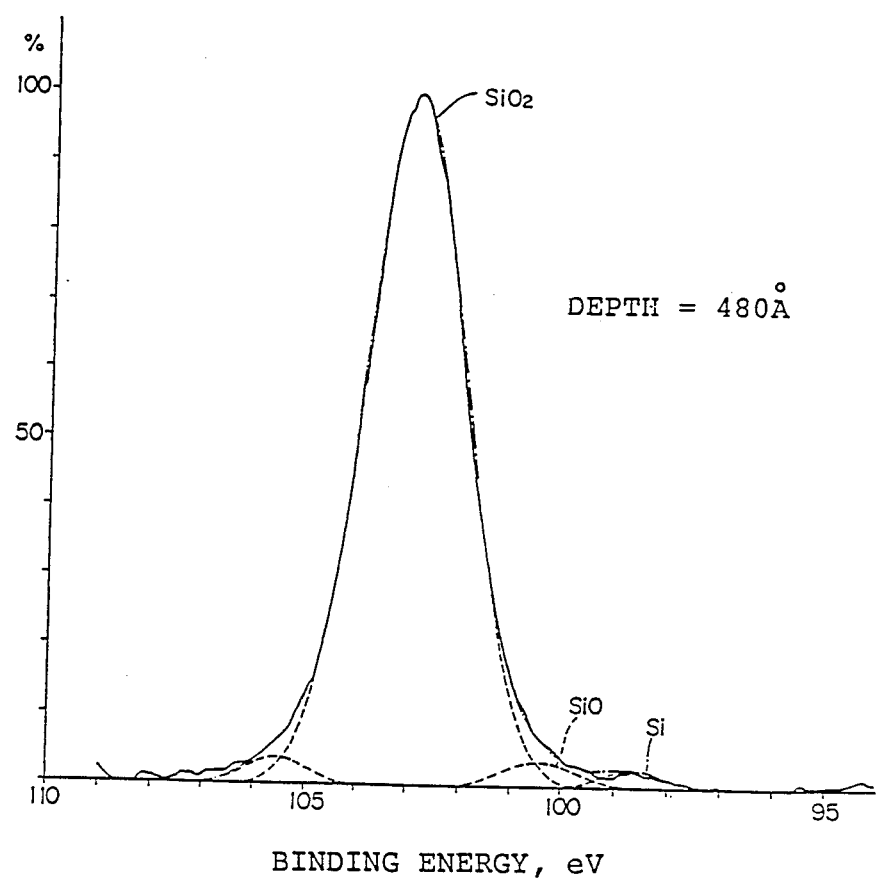

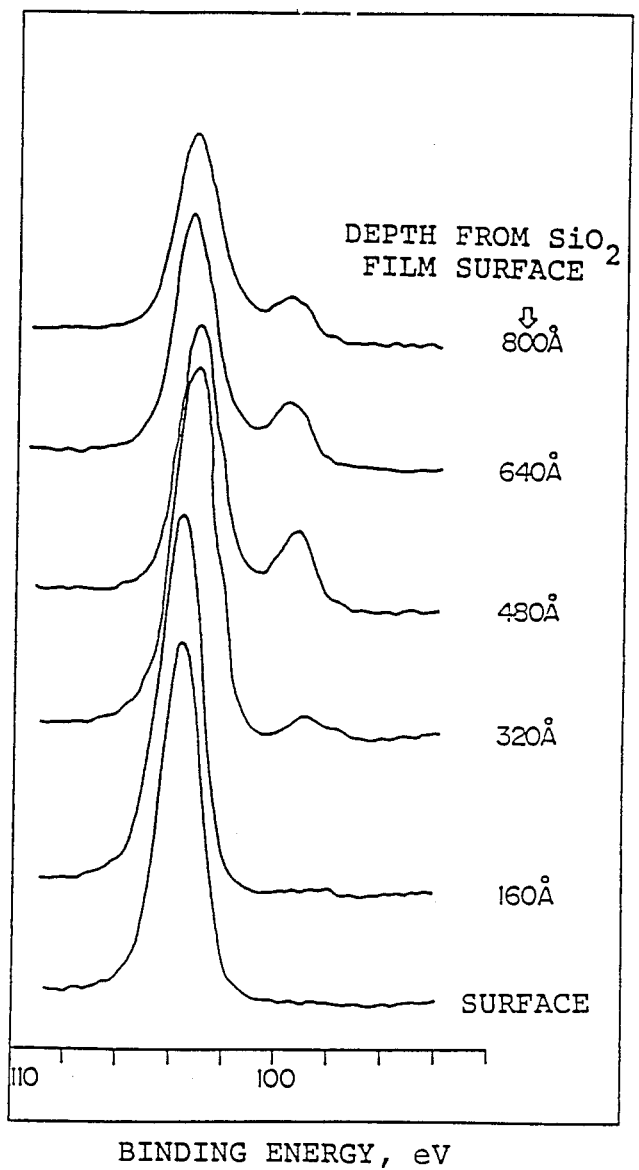

4,849,248

ION IMPLANTATION METHOD FOR MAKING SILICON-RICH SILICON DIOXIDE FILM

FIELD OF THE INVENTION

The present invention relates to a silicon dioxide film for use in a semiconductor device and to a process of fabricating such a silicon dioxide film.

BACKGROUND OF THE INVENTION

As well known in the art, films or layers of silicon dioxide are used at various levels of a semiconductor device and in various kinds of semiconductor devices. The physical properties and other attributes of such silicon dioxide films predominant over the various performance characteristics of the semiconductor devices incorporating the films. An object of the present invention is to provide a novel silicon dioxide film exhibiting various advantageous electrical and optical performance characteristics. Another object of the invention is to provide a method of fabricating such a novel and useful silicon dioxide film. Still another object of the present invention is to provide various semiconductor devices each utilizing such a silicon dioxide film.

SUMMARY OF THE INVENTION

In accordance with one outstanding aspect of the present invention, there is provided a silicon dioxide film containing additional silicon in the form of segregates having controlled grain sizes.

In accordance with another outstanding aspect of the present invention, there is provided a method of producing a silicon-rich silicon dioxide film comprising the steps of (a) forming a silicon dioxide, (b) injecting silicon ions into the silicon dioxide film by ion implantation with a predetermined ion acceleration energy and a predetermined ion dose, and (c) annealing the resultant silicon dioxide film for causing the additional silicon atoms in the silicon dioxide film to segregate therein to form segregates of silicon having grain sizes which are substantially predominated by said predetermined ion acceleration energy and said predetermined ion dose.

BRIEF DESCRIPTION OF THE DRAWINGS

The features and advantages of a silicon dioxide film according to the present invention and a process of fabricating such a film in accordance with the present invention will be more clearly appreciated from the following description taken in conjunction with the accompanying drawings in which:

FIGS. 3A, 3B and 3C are spectrum diagrams each showing the separate spectrum waveforms for the $SiO_2$, SiO and Si components of the material forming the sample film used in the XPS analysis of FIG. 2 particularly for each of the depths of 0 Å, 320 Å and 480 Å from the surface of the silicon dioxide film;

FIG. 4 is a spectrum diagram similar to FIG. 2 but shows the results of the XPS analysis conducted with a sample silicon dioxide film fabricated using the annealing treatment after ion implantation with silicon ions in carrying out a method according to the present invention;

DESCRIPTION OF THE PREFERRED EMBODIMENTS

Figure 1A:
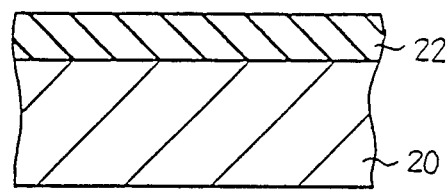
FIGS. 1A and 1B are fragmentary cross sectional views showing portions of a semiconductor which is in the course of a process of fabricating a silicon dioxide film according to the present invention.
Figure 1B:
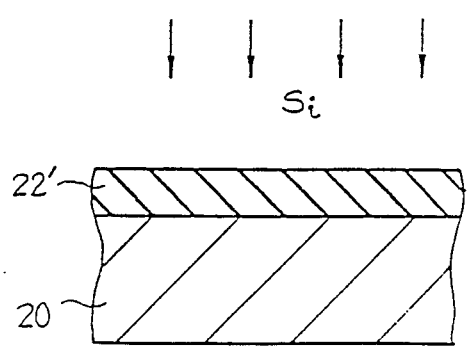

FIGS. 1A and 1B show basic steps of a process of forming a silicon dioxide film according to the present invention. As first shown in FIG. 1A, a process according to the present invention starts with preparation of a suitable semiconductor substrate or base layer 20 of, typically, monosilicon. On one surface of this semiconductor base layer 20 is grown a silicon dioxide film 22 by, for example, ordinary thermal oxidation techniques. While the silicon dioxide film 22 thus formed on the base layer 20 will provide any function or find any practical application, the film 20 is typically used to form a gate oxide film in a mttal-oxide-semiconductor field-effect transistor (MOSFET) as well known in the art.

Into the silicon dioxide film 22 thus formed on the semiconductor base layer 20 are then injected silicon ions by ion implantation techniques as indicated by arrows in FIG. 1B using a predetermined ion acceleration energy and a predetermined dose. The predetermined ion acceleration energy used for this ion implant process is preferably within the range of 20 keV to 50 keV, while the predetermined dose used along with such an acceleration energy is preferably within the range of $1 \times 10^{16}$ atoms/cm$^2$ to $8 \times 10^{16}$ atoms/cm$^2$, which results in a concentration within the range of $5 \times 10^{20}$ atoms/cm$^3$ to $5 \times 10^{21}$ atoms/cm$^3$. The resultant semiconductor structure is annealed under predetermined conditions such as, preferably, at a temperature within the range of 900° C. to 1100° C. for a predetermined period of time within the range of 20 minutes to 40 minutes.

As a result of the implantation of silicon ions and the subsequent annealing treatment, the silicon dioxide film has produced therein segregates of silicon (which are, for example, in the form of clusters with grain sizes of about 20 angstroms in major diameter). In FIG. 1B, the silicon dioxide film thus subjected to annealing is represented by 22' to distinguish the film from the initial "pure" silicon dioxide film 22. The grain sizes of such silicon segregates are controllable by the selection of the conditions (such as typically the ion acceleration energy and dose) under which silicon ions are to be implanted into the original pure silicon dioxide film 22. It may be herein noted that the term "pure" referred to in connection with silicon dioxide or a silicon dioxide film is intended to mean that the silicon dioxide which is said to be pure has silicon and oxygen atoms which are proportioned stoichiometrically.

It has been found that the silicon-rich silicon dioxide film 22' containing silicon segregates of such controlled grain sizes exhibit various advantageous electrical and optical performance characteristics which are distinct from those achievable from ordinary pure silicon dioxide films. Description will be hereinafter made regarding such prominent performance characteristics of a silicon dioxide film fabricated in accordance with the present invention.

It is considered that the implant of silicon ions into the initial silicon dioxide film 22 as hereinbefore discussed brings about the following effects within the bulk of the film 22. During implantation of silicon ions into the initial film 22, accelerated silicon atoms bombarded onto the silicon dioxide film 22 will impinge upon the pure silicon dioxide network forming the structure of the film 22 at any locations within the network and will partially break up the silicon dioxide network to produce dangling bonds. The atoms of silicon which have been injected into the silicon dioxide film 22 bind to these dangling bonds and in the result form a certain silicon-silicon oxide structure which can be represented generally by $Si_xO_y$. As well known in the art, the atoms of silicon and oxide which occur concurrently within a unit volume are stoichiometrically proportioned in the ratio of approximately 1 vs. 2. It is therefore quite likely from a statistic point of view that the silicon-silicon oxide structure $Si_xO_y$ contains more of the silicon monoxide (SiO) component than the other chemical components. As a matter fact, this statistic presumption has been justified by the results of the tests and experiments which the present inventor have thus far conducted, as will be described in more detail. It may be noted that the grain size of a silicon segregate is typically given in terms of the major diameter of the grain or, in this case, cluster.

Both silicon dioxide and silicon being thermally stable, the silicon-silicon oxide structure $Si_xO_y$ formed in the silicon dioxide film 22 is re-arranged into silicon dioxide and silicon as a result of the annealing treatment subsequent to the ion implantation process. This phenomenon has also been ascertained on an experimental basis. In addition, silicon has so small a diffusion coefficient in a silicon dioxide structure that the effect of the thermal diffusion of silicon atoms as caused by the annealing treatment may be deemed practically negligible. It may be for these reasons concluded that the segregation of silicon atoms in the annealed silicon dioxide film 22' has resulted solely from the relative shortage of silicon atoms in the silicon dioxide film 22' as caused in the course of the process in which the silicon-silicon oxide structure $Si_xO_y$ settles into silicon dioxide and silicon. This means that the grain sizes of the silicon segregates produced in the silicon dioxide film 22' are dictated by the density profile of the silicon oxide structure $Si_xO_y$. The density profile of the silicon-silicon oxide structure $Si_xO_y$ in turn depends significantly on the ion acceleration energy and the dose used for the ion implantation process and can therefore be controlled by proper selection of these process parameters.

Thus, the grain sizes of the silicon segregates to be produced in the pure silicon dioxide film 22 can be controlled by the proper selection of the ion acceleration energy and dose used for the ion implantation process to be carried out. The acceleration energy and dose used for an ion implantation process are largely predominant over the density distributions of the silicon-silicon oxide structure $Si_xO_y$ in lateral and vertical directions of the silicon dioxide film 22. As mentioned previously, the ion acceleration energy to be used for the ion implant process in carrying out a method according to the present invention is preferably within the range of 20 keV to 50 keV and the dose used along with such an acceleration energy is preferably within the range of $1 \times 10^{16}$ atoms/cm$^2$ to $8 \times 10^{16}$ atoms/cm$^2$. An acceleration energy of the order of $1 \times 10^{15}$ atoms/cm$^2$ would result in formation of a silicon dioxide film practically indistinct in quality and performance characteristics from ordinary, viz., pure silicon dioxide films. As also noted previously, the annealing treatment of the silicon dioxide film 22 to cause segregation of silicon atoms is effected preferably at a temperature within the range of 900° C. to 1100° C. for a period of time within the range of 20 minutes to 40 minutes such as typically about 30 minutes.

By controlling the grain sizes of the silicon segregates in the silicon dioxide film 22' as above described, various physical properties of the silicon dioxide film 22' such as for example the optical index of refraction and the light transmissivity of the film 22' can be varied as desired. Also variable by controlling the grain sizes of the silicon segregates are the electrical conductivity and the dielectric constant of the silicon dioxide film 22'. The silion dioxide film providing such a wide range of variation in the physical properties will provide numerous new functions and capabilities and find various new practical applications which have not been expected of ordinary, pure silicon dioxide materials which are in wide use in semiconductor devices.

Description will be hereinafter made in regard to the results of the various laboratory tests and experiments which were conducted with the various silicon dioxide samples fabricated with various process parameters selected for the ion implantation and annealing procedures.

Figure 2:
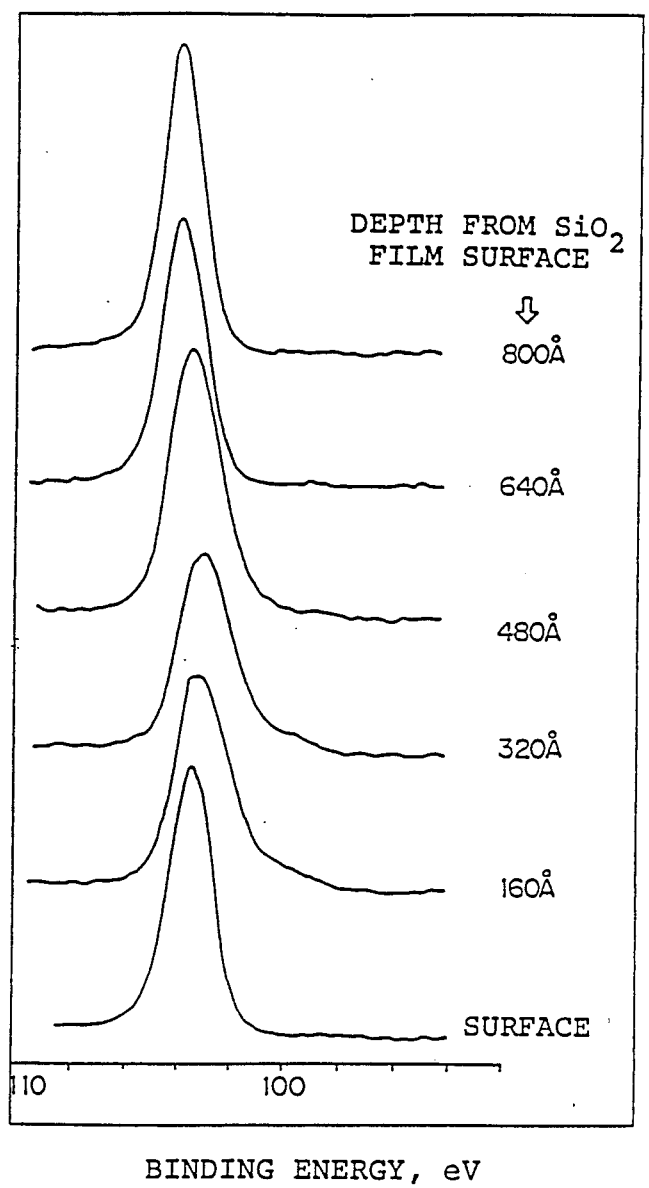
FIG. 2 is a spectrum diagram showing the results of the x-ray photoelectron spectrography (XPS) analysis conducted with a sample silicon dioxide film fabricated without using the annealing treatment after ion implantation with silicon ions.
Figure 3A:
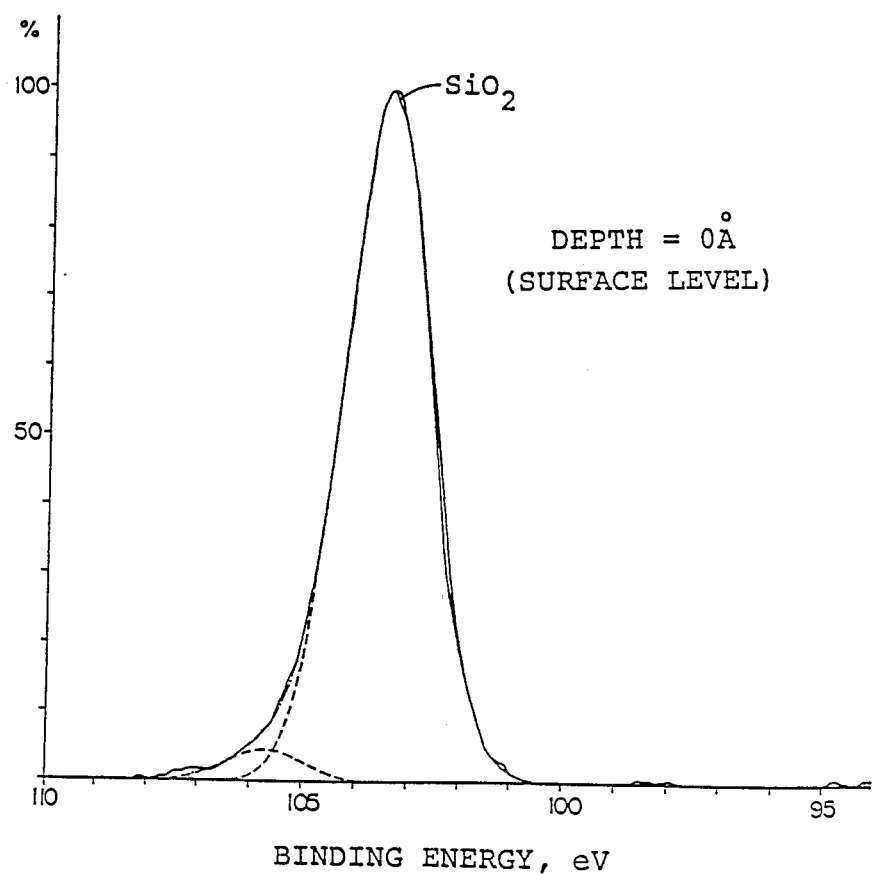
Figure 3B:
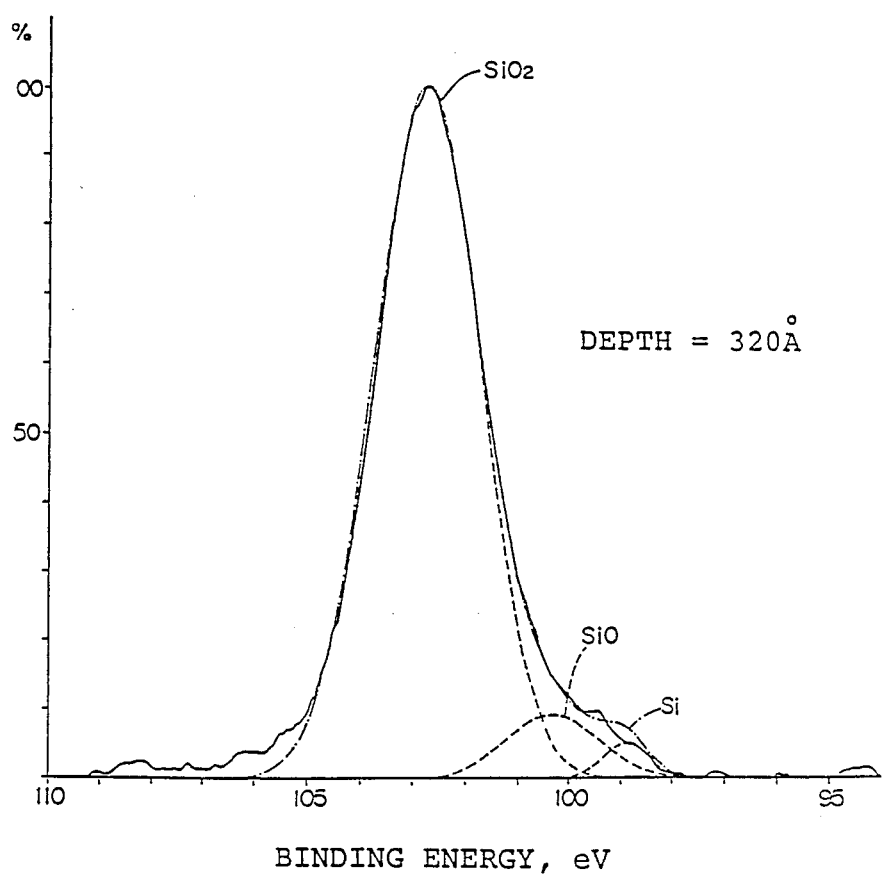

FIG. 2 shows the results of the x-ray photoelectron spectrography (XPS) analysis conducted with a silicon dioxide sample which was fabricated without using the annealing treatment after ion implantation. The silicon dioxide film was fabricated with the ion acceleration energy of 30 keV and the dose of $5 \times 10^{16}$ atoms/cm$^2$. Curves in FIG. 2 show the photoelectron spectra in terms of the binding energy of the emitted electron as observed at different depths of 0 Å (surface level), 160 Å, 320 Å, 480 Å, 640 Å and 800 Å, respectively, from the surface of the silicon dioxide film 22'. From among the data shown in FIG. 2, those for the depths of 0Å, 320 Å and 480 Å are further processed to determine separate spectral waveforms for the SiO$_2$, SiO and Si components of the material forming the sample film. FIGS. 3A, 3B and 3C show such spectrum waveforms.

FIG. 4 is similar to FIG. 2 but shows the results of the XPS analysis conducted with a sample silicon dioxide film fabricated using the annealing treatment after the ion implantation with silicon ions. Furthermore, FIGS. 5A, 5B and 5C are spectrum diagrams similar to FIGS. 3A, 3B and 3C, respectively, each now showing the spectrum waveforms for the SiO$_2$, SiO and Si components of the material forming the sample film used in the XPS analysis particularly for each of the depths of 0 Å, 320 Å and 480 Å from the surface of the silicon dioxide film.

As will be seen from comparison between the data shown in FIG. 2 and FIGS. 3A to 3C and the data shown in FIG. 4 and FIGS. 5A to 5C, the sample silicon dioxide film fabricated without using the annealing treatment after the ion implantation contains far more silicon monoxide than that contained in the silicon dioxide film fabricated using the annealing treatment. This suggests that the silicon monoxide, which per se is thermally unstable, has been decomposed to produce silicon dioxide and silicon for establishing a thermally stable state.

Figure 6:
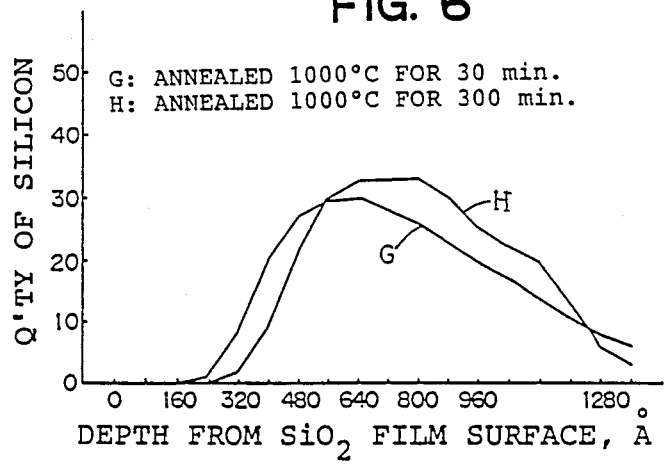
FIG. 6 is a graph showing the density profiles of the silicon segregates in two silicon dioxide sample films fabricated with annealing treatment at the same temperatures and for different periods of time.

FIG. 6 shows the density profile of the silicon component thus separated from the silicon monoxide in each of two silicon dioxide sample films which were subjected to annealing treatment at 1000° C. one for 30 minutes and the other for 300 minutes. Curve G shows the density profile for the silicon dioxide film annealed for 30 minutes while curve H shows the density profile for the ff annealed for 300 minutes. From comparison between these curves G and H it will be seen that there is no appreciable difference between the density profiles of the two silicon dioxide sample films where the annealing times differ only by a factor of ten. This clearly implies that the effect of the thermal diffusion of silicon atoms as caused by the post-implantation annealing treatment is practically negligible as noted previously.

Figure 5A:
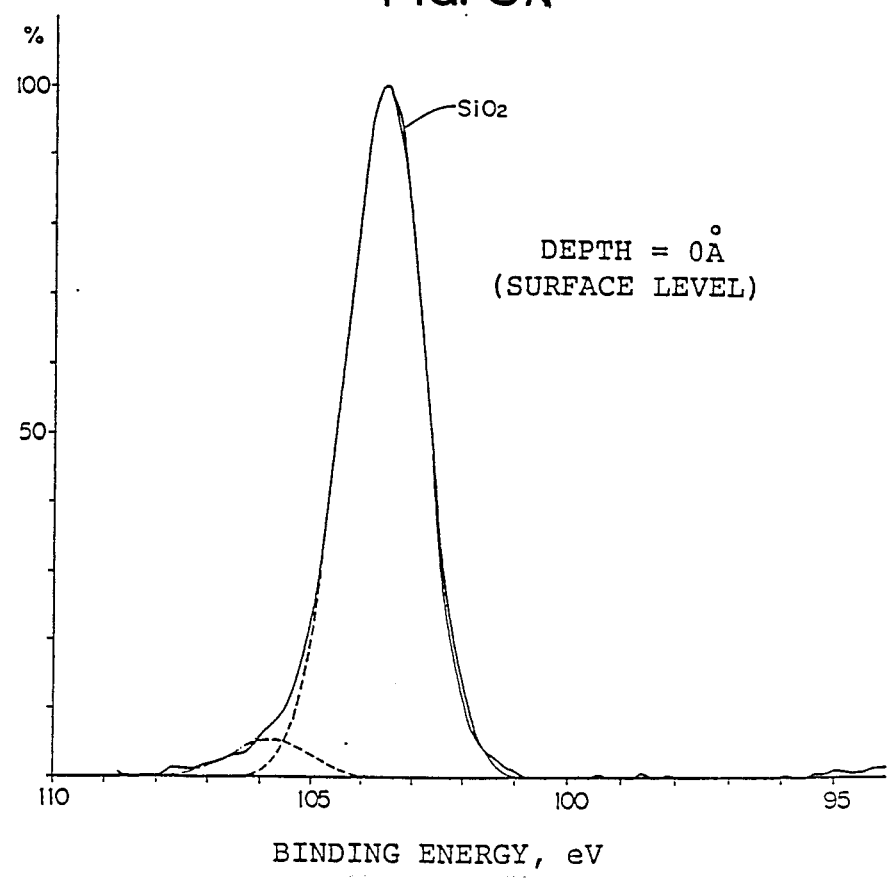
FIGS. 5A, 5B and 5C are spectrum diagrams similar to FIGS. 3A, 3B and 3C, respectively, each now showing the spectrum waveforms for the $SiO_2$, SiO and Si components of the material forming the sample film used in the XPS analysis of FIG. 4 particularly for each of the depths of 0 Å, 320 Å and 480 Å from the surface of the silicon dioxide film.
Figure 5B:
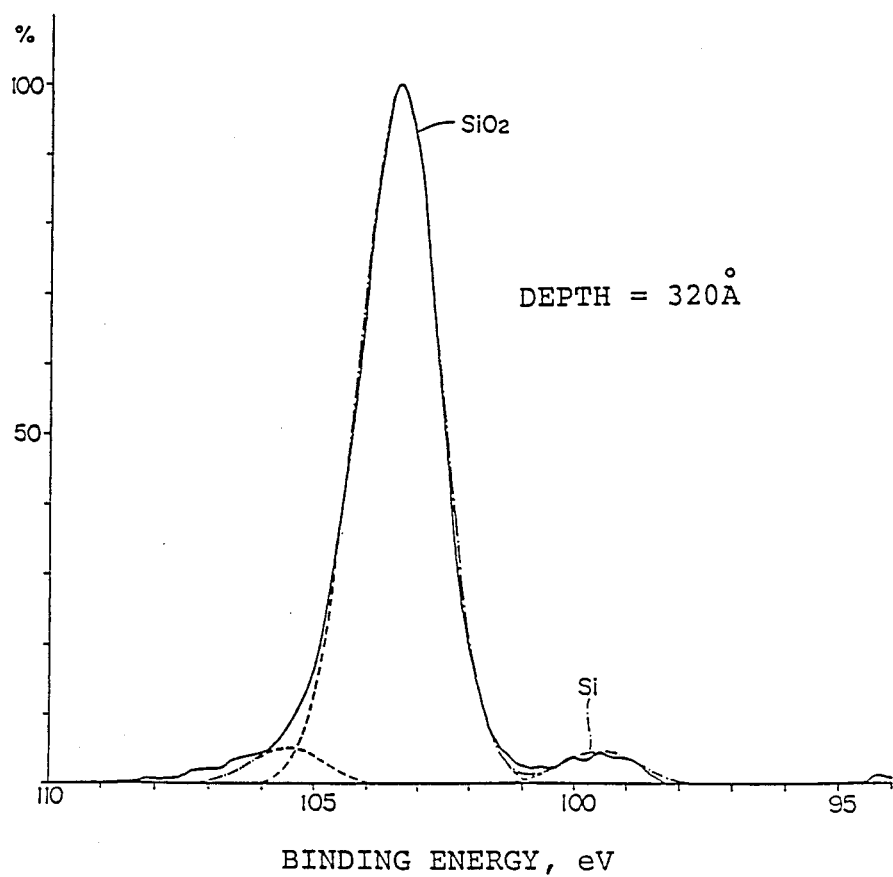
Figure 5C:
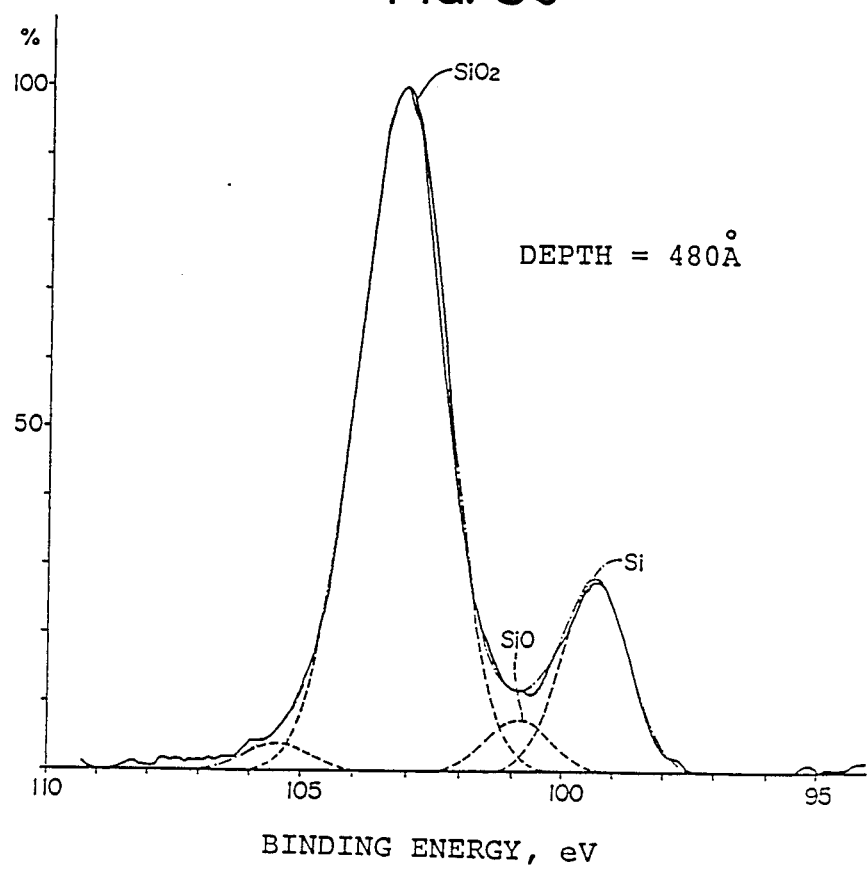
Figure 7:
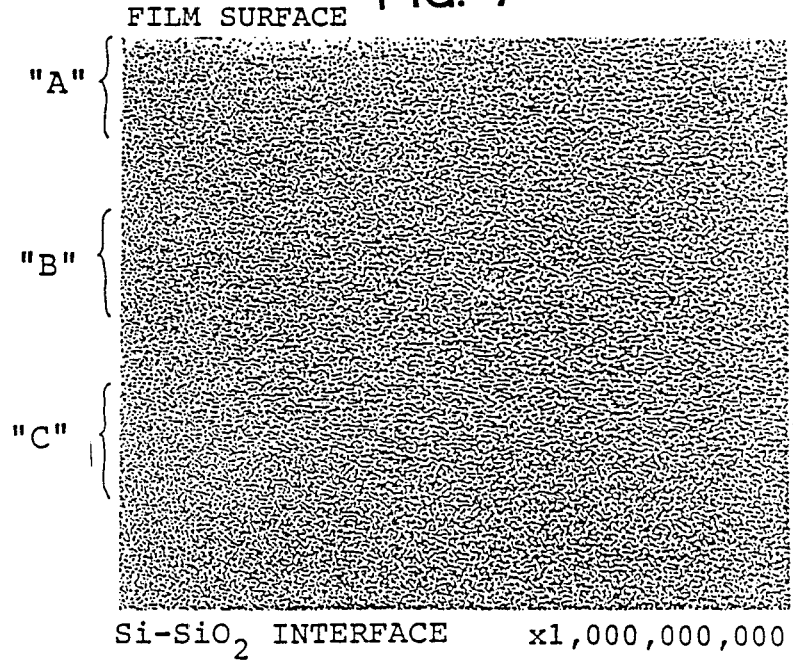
FIG. 7 is a transmission emission microscopy (TEM) photograph showing the TEM cross section of a silicon dioxide film similar to the silicon dioxide sample film used for the tests the results of which are shown in FIGS. 4 and 5A to 5B.

FIG. 7 is a transmission emission microscopy (TEM) photograph showing the TEM cross section of a silicon dioxide film fabricated using process parameters similar to those used for the fabrication of the silicon dioxide sample film which was tested to show the results shown in FIG. 4 and 5A to 5B. In FIG. 7, the areas indicated by "A", "B" and "C" of the shown TEM cross section respectively represent (a) a sectional area close to the surface level of the film, (b) a sectional area which is approximately 400 Å deep from the surface, and (c) a sectional area approximately 1500 Å deep from the surface.

Figure 8A:
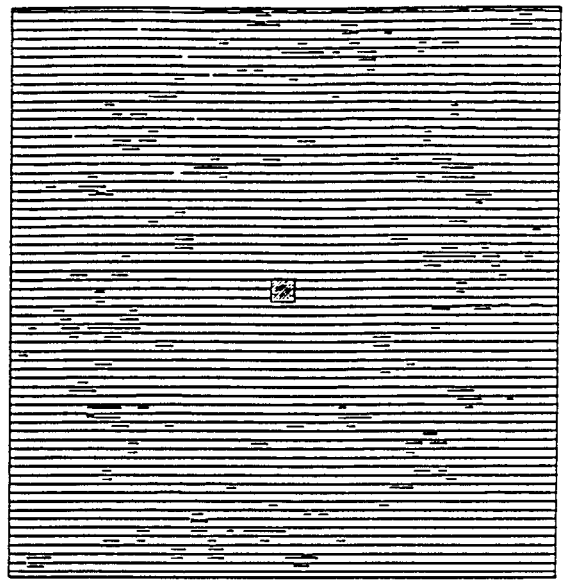
FIGS. 8A and 9A are computer graphic patterns produced by the data processing of the TEM cross section of FIG. 7 with the sectional area "A" of the TEM cross plotted against the grain sizes of the silicon segregates.
Figure 9A:
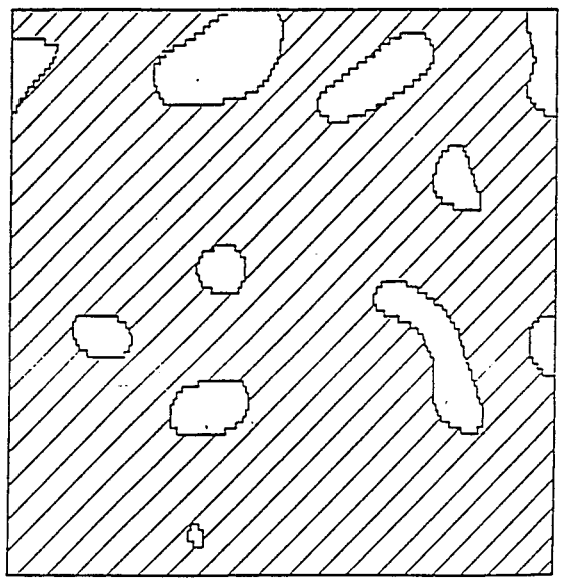
Figure 8B:
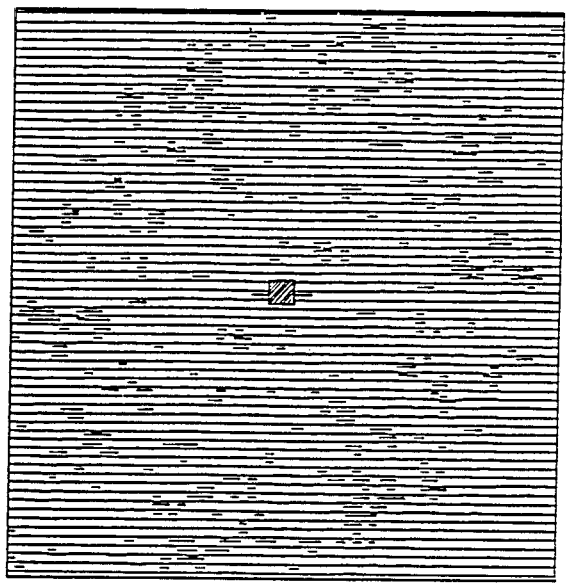
FIGS. 8B and 9B are computer graphic patterns produced by the data processing of the TEM cross section of FIG. 7 with the sectional area "B" of the TEM cross plotted against the grain sizes of the silicon segregates.
Figure 9B:
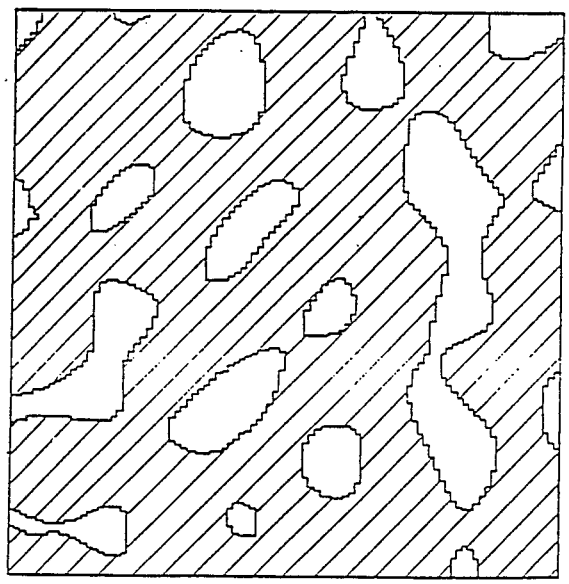
Figure 8C:
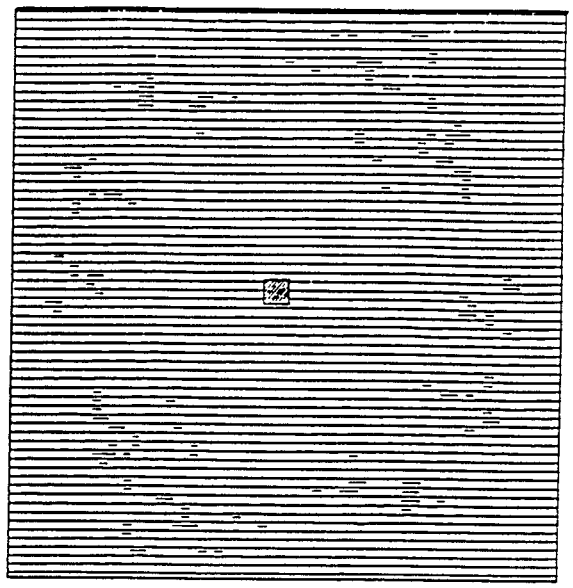
FIGS. 8C and 9C are computer graphic patterns produced by the data processing of the TEM cross section of FIG. 7 with the sectional area "C" of the TEM cross plotted against the grain sizes of the silicon segregates.
Figure 9C:
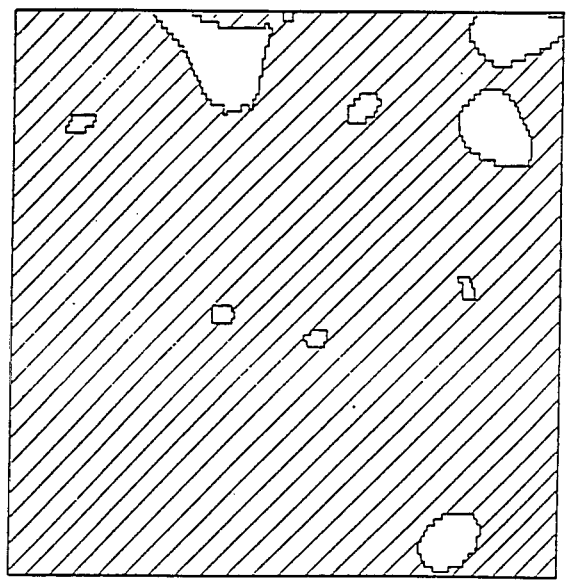

FIGS. 8A and 9A; 8B and 9B; and 8C and 9C are computer graphic patterns produced by the data processing of the TEM cross section of FIG. 7 with the sectional areas "A", "B" and "C" of the TEM cross plotted against the grain sizes of the silicon segregates. The computer graphic patterns shown in FIGS. 8A, 8B and 8C have been produced by sampling the TEM cross sectional areas "A", "B" and "C" of FIG. 7 and data processing the individual dark and bright patterns using a fast Fourier transform (FFT) algorithm, the patterns being plotted also against the grain sizes of the silicon segregates. Thus, FIGS. 8A, 8B and 8C show the density profiles of silicon in Fourier transformed spaces. On the other hand, the computer graphic patterns shown in FIGS. 9A, 9B and 9C have been produced by data processing the dark and bright patterns of the TEM cross sectional areas "A", "B" and "C" of FIG. 7 using an inverse Fourier transform algorithm, such patterns being plotted against the silicon grain sizes larger than 20 Å. The density profiles of such silicon grains are thus shown on the real-space coordinates in FIG. 7.

As will be seen from FIGS. 7 and 8A, there exists an extremely small quantity of silicon atoms within the cross sectional area "A" close to the surface level of the silicon-rich silicon dioxide film. FIGS. 7 and 8B show that silicon grains are distributed with a considerably density in the intermediate cross sectional area "B" of the film. From the data shown in FIGS. 7 and 8C it will be seen that the cross sectional area "C" close to the interface between the silicon dioxide film and the base layer or substrate of monosilicon is scarcely affected by the ion implantation with silicon. From FIGS. 9A, 9B and 9C, it will be further seen that there are only limited numbers of clusters measuring more than 20 Å within the cross sectional areas "A" and "C" while a considerably large number of such clusters are observed to exist in the cross sectional area "B" of the silicon dioxide film. It is presumed that these clusters are of the segregates of silicon.

Figure 10A:
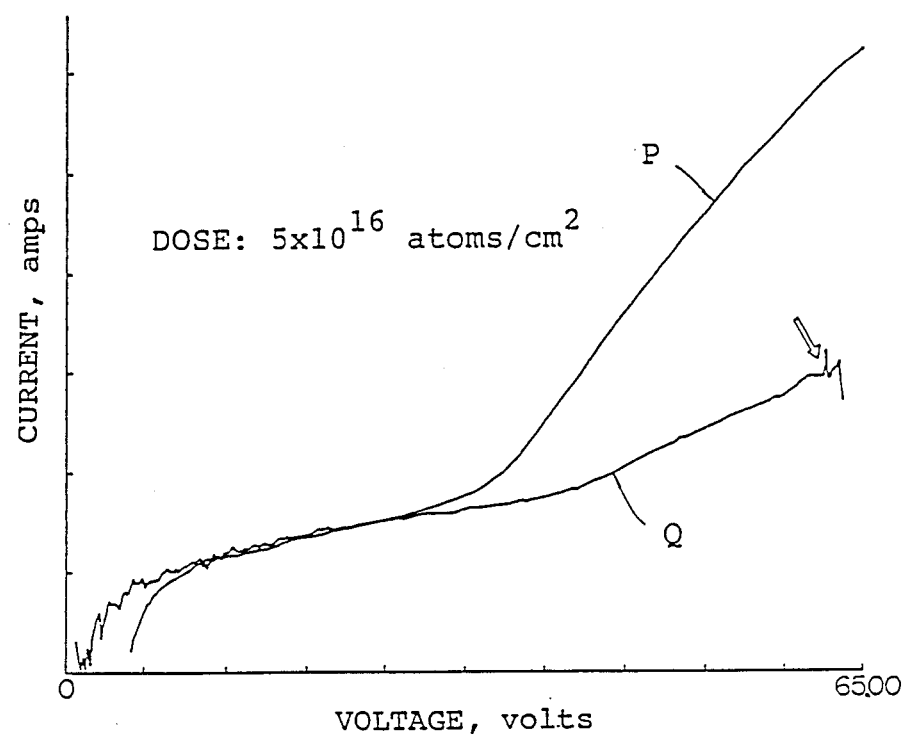
FIG. 10A is a graphic representation of the current-voltage characteristics of a silicon-rich silicon dioxide film provided in accordance with the present invention and of an ordinary pure silicon dioxide film.
Figure 10B:
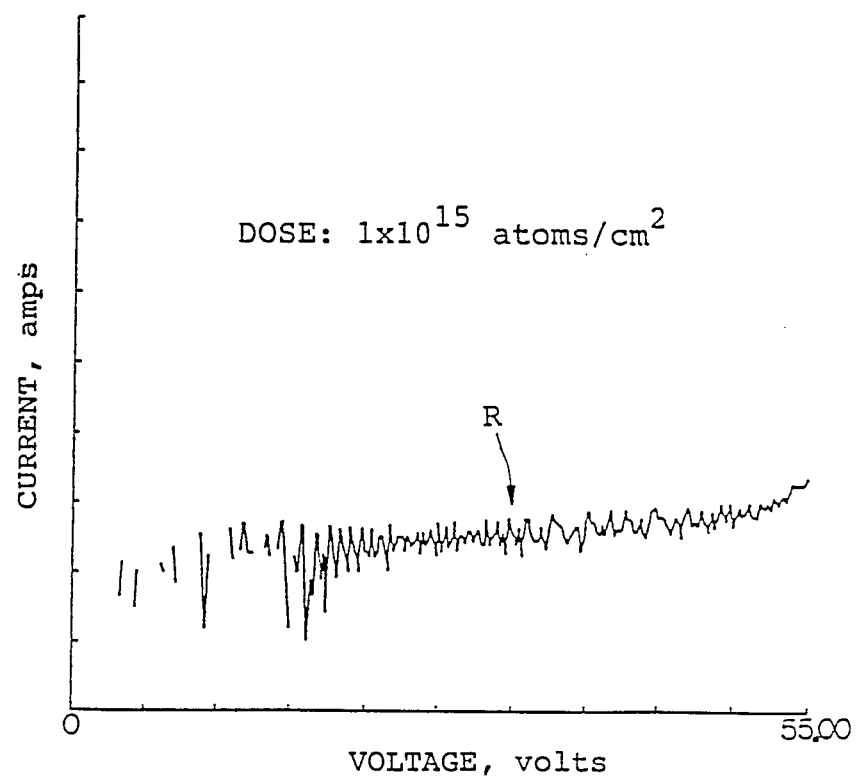
FIGS. 10B and 10C are similar to FIG. 10A but show electrical characteristics of silicon-rich silicon dioxide films fabricated with doses for the implantation selected to be lower than a specific range preferred in implementing the present invention.
Figure 10C:
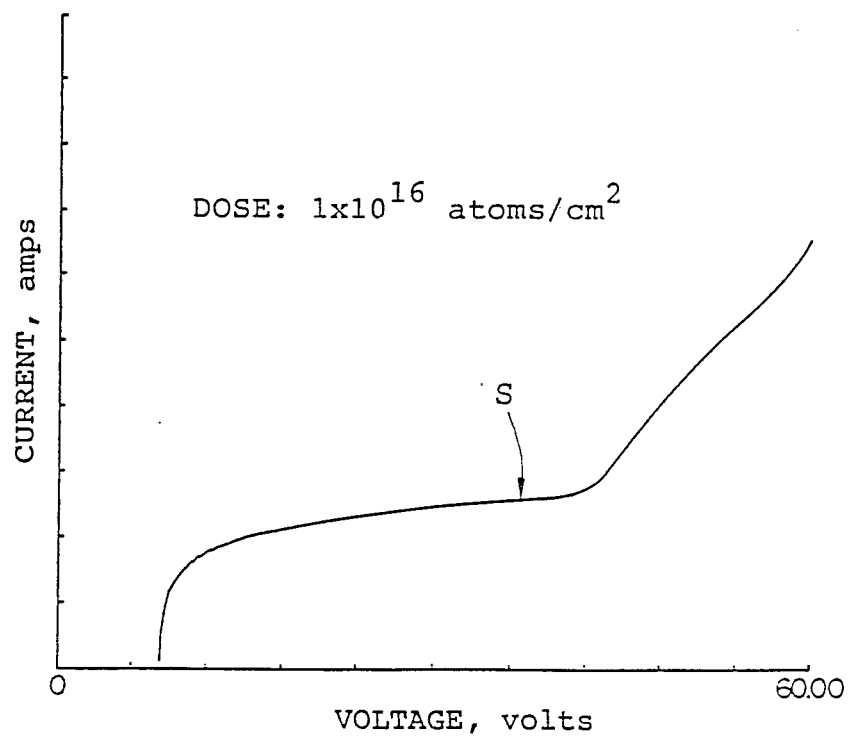

FIG. 10A shows the current-voltage characteristics of a silicon-rich silicon dioxide film provided in accordance with the present invention as indicated by curve P and of an ordinary pure silicon dioxide film as indicated by curve Q. The silicon-rich silicon dioxide film used for the tests was fabricated with a dose of $5 \times 10^{16}$ atoms/cm$^2$ for the ion implantation using the same process parameters as those for the fabrication of the sample film used for the tests the results of which are shown in FIG. 4 and 5A to 5B. Each of this silicon-rich silicon dioxide film and the pure silicon dioxide film used was 700 Å in thickness. FIGS. 10B and 10C show similar electrical characteristics of silicon-rich silicon dioxide films fabricated with doses of $1\times10^{15}$ atoms/cm$^2$ (curve R) and $1\times10^{16}$ atoms/cm$^2$ (curve S), respectively, for the implantation with silicon ions. Each of the sample films used for the tests which revealed the electrical characteristics shown in FIGS. 10B and 10C was annealed at 1000° C. for 30 minutes and was 700 Å in thickness.

From FIG. 10A it will be seen that while a pure silicon dioxide film is likely to cause breakdown at 60 to 65 volts as indicated by curve Q the silicon-rich silicon dioxide film with additional silicon atoms injected therein is unlikely to cause breakdown at voltages lower than 65 volts or even higher as indicated by curve P. As will be apparent from comparison between the curve Q of FIG. 10A and curve R of 10B, furthermore, there is no appreciable difference between the electrical characteristics of the silicon-rich silicon dioxide film fabricated with the dose of $1\times10^{15}$ atoms/cm$^2$ (curve R) and those of the pure silicon dioxide film (curve Q). In addition, comparison between curves Q and S of FIGS. 10A and 10C shows that the increase in dose from $1\times10^{16}$ atoms/cm$^2$ to $5\times10^{16}$ atoms/cm$^2$ results in a corresponding increase in the conductivity of a silicon-rich silicon dioxide film.

As will have been understood from the foregoing analyses, a silicon dioxide film proposed by the present invention offers outstanding advantages particularly in controlling the conductivity and breakdown characteristics of the film. Description will be hereinafter made in regard to some preferred examples of the semiconductor devices each using such an advantageous silicon dioxide film proposed by the present invention.

Figure 11:
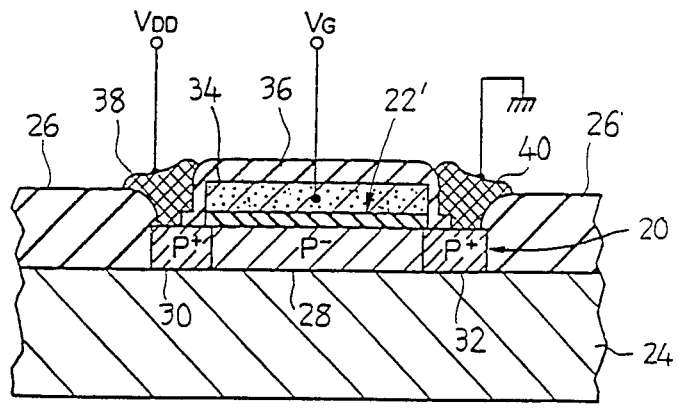
FIG. 11 is a fragmentary cross sectional view showing an example of a MOSFET device of silicon-on-sapphire (SOS) configuration incorporating a silicon-rich silicon dioxide film proposed by the present invention.

In FIG. 11 is shown a p-channel MOSFET device of silicon-on-sapphire (SOS) configuration using a silicon-rich silicon dioxide film proposed by the present invention. The structure which has been illustrated in FIG. 1A is herein shown formed on the surface of a substrate 24 of sapphire on which monosilicon is grown to form the previously mentioned semiconductor base layer 20. The monosilicon base layer 20 is shown intervening between field oxide regions 26 which are also formed on the surface of the sapphire substrate 24. The silicon base layer 20 has defined therein an intermediate lightly-doped p$^-$-type region 28 and a pair of heavily-doped p$^+$-type regions 30 and 32 provided on both sides of the lightly-doped p$^-$-type region 28. One of the heavily-doped p$^+$-type regions 30 and 32 is to form the source region and the other to form the drain region of the MOSFET device. The lightly-doped p$^-$-type region 28 intervening between these p$^+$-type regions 30 and 32 is to provide a channel region between the source and drain regions. The silicon-rich silicon dioxide film 22' proposed by the present invention as formed on such a silicon base layer 20 is partly etched away on the source/drain regions 30 and 32 and is to form a gate oxide region of the MOSFET device. On this gate oxide region 22' is provided a gate region 34 of, typically, polysilicon which is covered with an insulator oxide layer 36 of ordinary silicon dioxide. The source/drain regions 30 and 32 each of which is in part exposed with the silicon dioxide film 22' partly etched away are contacted by conductor layers 38 and 40 of, for example, aluminum for connection to a source of a supply voltage $V_{DD}$ and to a ground line, respectively. The gate region 34 is to be connected to a supply source of a suitable gate voltage $V_G$ as shown. The MOSFET device thus configured is known as deep-depression transistor. Alanysis has been energetically made into such a MOSFET device by, for example, S. R. Hofstein (IEEE Transactions of Electron Devices, Vol. ED-13, No. 12, December 1966).

In a deep-depression MOSFET device, it is preferred to have the source region of the device connected to a source of a positive supply voltage $V_{DD}$ (which is herein assumed to be 5 volts by way of example) with the drain region connected to a ground line. In the structure shown in FIG. 11, it is thus assumed that the p$^+$-type region 32 forms the drain region and the p$^+$-type region 30 forms the source region of the MOSFET device. The potential on the base layer 20 is dictated by the current to flow through the layer 20 and thus varies linearly along the channel region 28 of the device, peaking up at a voltage not higher than the supply voltage $V_{DD}$. The drain region 32 being assumed to be connected to ground, furthermore, the potential level on the base layer 20 adjacent the drain region 32 is zero volts. Assuming that the gate voltage $V_G$ applied to the gate region 34 of the device is also zero volts, there is no depletion layer developed in the base layer 20 which would otherwise be created by application of a gate voltage. In this instance, the MOSFET device of the shown configuration acts as a resistance element. If the gate voltage $V_G$ used for such a device is then increased gradually, a depletion layer appears in the base layer 20 first in the vicinity of the drain region 32. It therefore follows that the current-carrying path in the channel region 28 of the layer 20 is narrowed accordingly, with a consequent decrease in the current which flows between the source and drain regions 30 and 32. If the gate voltage $V_G$ is thereafter raised to a level approximating the supply voltage $V_{DD}$ of 5 volts as herein assumed, the depletion layer in the base layer 20 could not extend far to the source region 30 with a potential of approximately 5 volts established on the base layer 20 in the vicinity of the source region 30.

Research efforts have been made to see if there could be a case where the current through the channel region is completely cut off with a non-depleted area left in the vicinity of the source region in a p-channel deep-depression transistor of the construction hereinbefore described. The conclusion reached as a result of such research efforts is as follows. If the p-channel deep-depression device pinches off with the flow of current completely cut off between the source and drain regions of the device before the depletion layer is permitted to reach the source region, the potential which occurs at the front of the depletion layer adjacent the source region must approximate 5 volts. If the potential at this location of the channel region is 5 volts, then the channel region could not be depleted at the particular location since the potential at the location under consideration is free from the effect of the field established at the gate which is also maintained at 5 volts. The result must be that the front of the depletion layer adjacent the source region withdraw toward the drain region until a current starts to flow through the channel region to diminish the potential thereon. This means that a saturation current flows whenever the gate voltage is equal to or lower than the potential at the source region.

From the above consideration it will be understood that, in the case of a known p-channel deep-depletion transistor, the gate voltage must be higher than the source voltage in order to enable the transistor to completely cut off the flow of current through the channel region of the device. This will involve the requirement for the provision of an extra voltage step-up circuit to step up the voltage to be applied to the gate of the device or for the use of voltage supply sources of three different voltages (which may typically be 0 volts, $+V_{DD}$ and $-V_{DD}$). The use of such an extra voltage step-up circuit or three different voltage sources would destroy or at least impair the inherent advantages of deep-channel transistors over ordinary depletion-type MOSFET devices.

The device shown in FIG. 11 is characterized in that the gate oxide region thereof is provided by the silicon-rich silicon dioxide film 22' of the described favorable nature. By the provision of such a gate oxide region, the following two advantageous effects can be achieved of the device:

(1) a charge-carrying layer is formed adjacent the interface between the base layer 20 and the gate oxide region formed by the silicon-rich silicon dioxide film 22'; and (2) a trap level is formed within the gate oxide region 22' so that holes or electrons are introduced into the traps to afford a positive or negative potential, respectively, to the surface state.

By virtue of these advantageous effects, the potential at the interface between the base layer 20 and the gate oxide region 22' can be controlled effectively to control the field strength of the gate. Introduction of additional silicon atoms into the original silicon dioxide film 22 (FIG. 1A) results in deviation from the intrinsic stoichiometric ratio of the silicon dioxide per se and thus facilitates tunneling and accordingly injection of holes or electrons into the gate oxide region 22' from the gate region 34. This contributes to increasing the surface state and, in the result, will enable the deep-depression device to completely pinch off without having recourse to the provision of an extra step-up circuit (or a step-down circuit as the case may be) and by the use of only two voltages (which may typically be 0 volts and $V_{DD}$). It may also be noted that a further advantage is achieved in such a device in that the device can dispense with a floating gate.

While the deep-depression MOSFET device shown in FIG. 11 may be fabricated in any desired manner, a preferred example of a process of fabricating such a device will be hereinafter described with reference to FIGS. 11A and 11B.

The process of fabricating the device starts with a step of hetero-epitaxially growing a lightly-doped p$^-$-type monosilicon layer which is to result in the base layer 20 on the sapphire substrate 24. A film of pure silicon dioxide (not shown) is formed on the surface of the resultant monosilicon layer and is patterned and etched to define the region to form the base layer 20. Subsequently, the monosilicon layer is anisotropically etched away with the remaining oxide film used as a mask to form the base layer 20 on the substrate 24. The oxide film on the base layer 20 is then partly removed whereupon a suitable acceptor-type dopant such as boron is injected into the exposed portions of the base layer 20 to form the heavily-doped p$^+$-type regions 30 and 32 which are to provide the source and drain regions of the device as previously discussed. After the residual oxide film is removed from the base layer 20, a pure silicon dioxide film 22 is newly formed on the surface of the base layer 20 and on the exposed surface areas of the substrate 24 and is patterned and etched to leave a portion on the base layer 20. The field oxide regions 26 are then formed on the exposed surface areas of the substrate 24 as shown, followed by formation of a conformal layer of polysilicon 34 which is to result in the gate region 34 of the configuration shown in FIG. 11.

Figure 11A:
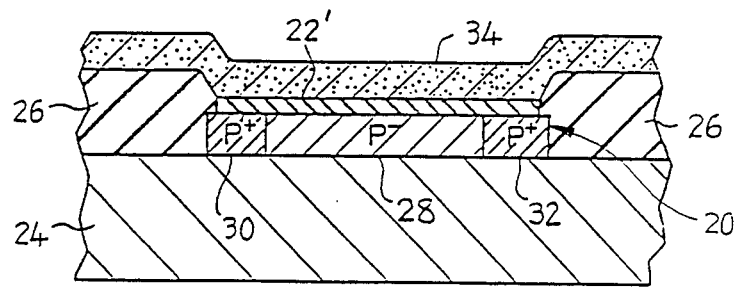
FIGS. 11A and 11B are fragmentary cross sectional views showing semiconductor structures which may be formed at different stages of a process of fabricating the device shown in FIG. 11.
Figure 11B:
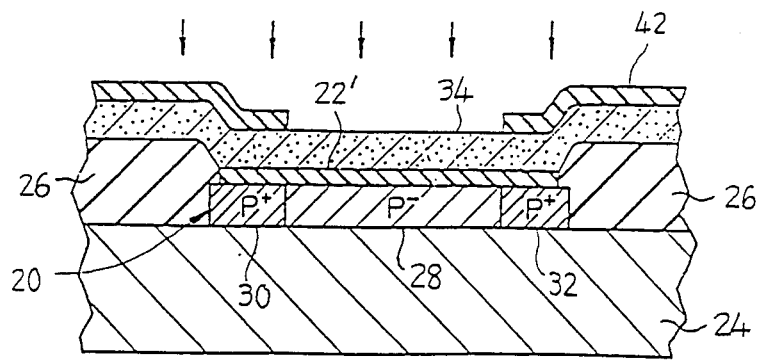

As shown in FIG. 11B, a photoresist coating 42 is then spun on to the resultant structure shown in FIG. 11A and is etched to remove its portion overlying the gate oxide region 22' with use of a suitable photomask (not shown). Silicon ions are then injected into the silicon dioxide film 22 by ion implantation techniques as indicated by arrows in FIG. 11B using a predetermined ion acceleration energy and a predetermined ion dose. As previously noted, the predetermined ion acceleration energy used for this ion implant process is preferably within the range of 20 keV to 50 keV and while the predetermined dose is preferably within the range of $1 \times 10^{16}$ atoms/cm$^2$ to $8 \times 10^{16}$ atoms/cm$^2$. The range of the ion acceleration energy is important to enable the silicon atoms to distribute with a density profile which becomes maximal at or adjacent the interface between the base layer 20 and the gate oxide region 22'. After the photoresist coating 42 is removed, the resultant semiconductor structure is subjected to annealing preferably at a temperature within the range of 900° C. to 1100° C. and for a period of time within the range of 20 minutes to 40 minutes as also noted previously. The polysilicon layer 34 is then patterned and etched to form the gate oxide region 34 of the configuration shown in FIG. 11 and is covered with the insulator oxide layer 36 of ordinary silicon dioxide. The conductor layers 38 and 40 of, for example, aluminum are thereupon deposited on the exposed surface portions of the source and drain regions 30 and 32, respectively, to produce the structure shown in FIG. 11.

Figure 12:
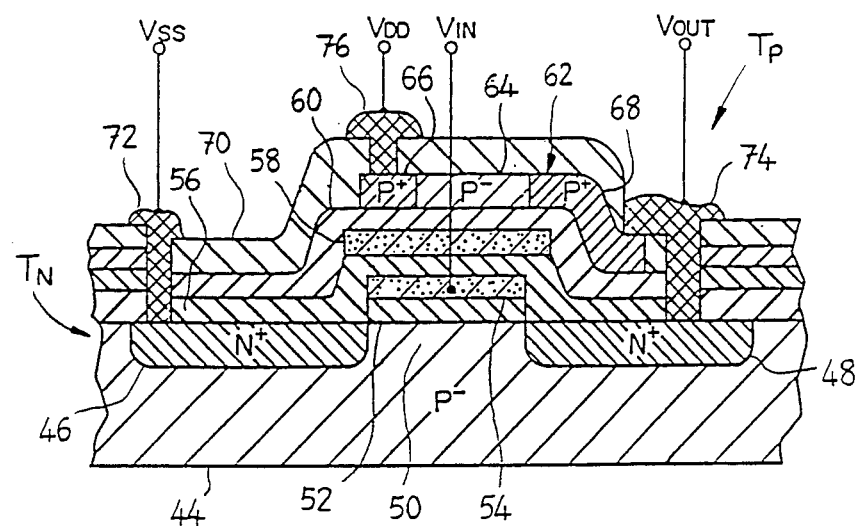
FIG. 12 is a fragmentary cross sectional view showing an example of a three-dimensional integrated circuit structure incorporating a silicon-rich silicon dioxide film proposed by the present invention.

In FIG. 12 is now shown a three-dimensional integrated circuit structure composed of a combination of an n-channel MOSFET $T_N$ and a p-channel deep-depression transistor $T_P$ to form an inverter circuit incorporating the silicon-rich silicon dioxide film proposed by the present invention. The circuit structure comprises a p$^-$-type silicon substrate 44 having formed therein a pair of heavily-doped n$^+$-type regions 46 and 48 which are spaced apart from each other to define a channel region 50 therebetween. One of these p$^+$-type regions such as the region 46 is to form the source region and the other region, viz., the region 48 is to form the drain region of the n-channel MOSFET $T_N$. On the channel region 50 of the substrate 44 is provided a gate oxide layer 52 of ordinary silicon dioxide which underlies a gate region 54 of polysilicon. The polysilicon gate region 54 and the surface of the silicon substrate 44 circumscribing the gate oxide layer 52 are covered with an insulator oxide layer 56 which is also of ordinary silicon dioxide.

On the silicon insulator oxide layer 56 is formed a polysilicon layer 58 which overlies the gate region 54 across a portion of the insulator oxide layer 56. The polysilicon layer 58 is to provide a floating gate region of the p-channel deep-depression transistor $T_P$ and is covered with an interlevel silicon dioxide layer 60 which also covers the exposed surface of the insulator oxide layer 56 on the silicon substrate 44. This interlevel silicon dioxide layer 60 is formed by the silicon-rich silicon dioxide film proposed by the present invention to provide the gate oxide layer of the deep-depression transistor $T_P$. On this gate oxide layer 60 is formed a silicon layer 62 which has an intermediate lightly-doped p$^-$-type region 64 and a pair of heavily-doped p$^+$-type regions 66 and 68 provided on both sides of the lightly-doped p⁻-type region 64. One of the heavily-doped p⁺-type region such as the region 66 is to form the source region and the other, viz., the region 68 is to form the drain region of the transistor $T_P$. The drain region 68 of the transistor $T_P$ has a portion overlapping the drain region 50 of the n-channel MOSFET $T_N$ across a portion of the gate oxide layer 60 of the transistor $T_P$. The lightly-doped p⁻-type region 64 intervening between the source and drain regions 66 and 68 is to provide the channel region of the transistor $T_P$. The silicon layer 58 and the exposed surface of the gate oxide layer 60 are covered with a top level insulator oxide layer 70 of ordinary silicon dioxide, with an edge portion of the drain region 68 left exposed as shown.

In contact with the source and drain regions 46 and 48 of the MOSFET $T_N$ are provided conductor regions 72 and 74, respectively, which extend through the insulator oxide layer 56, silicon dioxide layer 60 and insulator oxide layer 70 as shown. Also provided is a conductor region 76 which contacts the source region 66 of the deep-depression transistor $T_P$ through the insulator oxide layer 70. The conductor region 76 contacts not only the drain region 48 of the MOSFET $T_N$ but also the drain region 68 of the deep-depression transistor $T_P$. Though not shown, a conductor layer is further provided in contact with the gate region 54. This conductor layer is to be connected to an input terminal $V_{IN}$ while the conductor region 74 interconnecting the drain regions 48 and 68 is to be connected to an output terminal $V_{OUT}$, as shown. The conductor region 76 contacting the source region 66 of the deep-depression transistor $T_P$ is to be connected to a source of a supply voltage $V_{DD}$ while the conductor region 72 contacting the source region 46 of the MOSFET $T_N$ is to be connected to a ground line ($V_{SS}$).

In the inverter circuit structure constructed and arranged as hereinbefore described, the p-channel deep-depression transistor $T_P$ is caused to pinch off with holes injected into the floating gate region 58 of the transistor $T_P$. The holes are injected into the floating gate region 58 from the source region 66 through the gate oxide layer 60 when the supply voltage $V_{DD}$ is applied to the source region 66 through the conductor region 76. This is necessitated only on the part of the manufacturer of the circuit structure and is of no concern on the part of the user. The gate oxide layer 60 being formed of the silicon-rich silicon dioxide film proposed by the present invention, the resistance value of the layer 60 can be readily controlled on the part of the user as will be understood from the previous description. Carriers can thus be easily and effectively injected into the layer 60 by virtue of the tunnel effect advantageously achievable of the layer 60.

Figure 13:
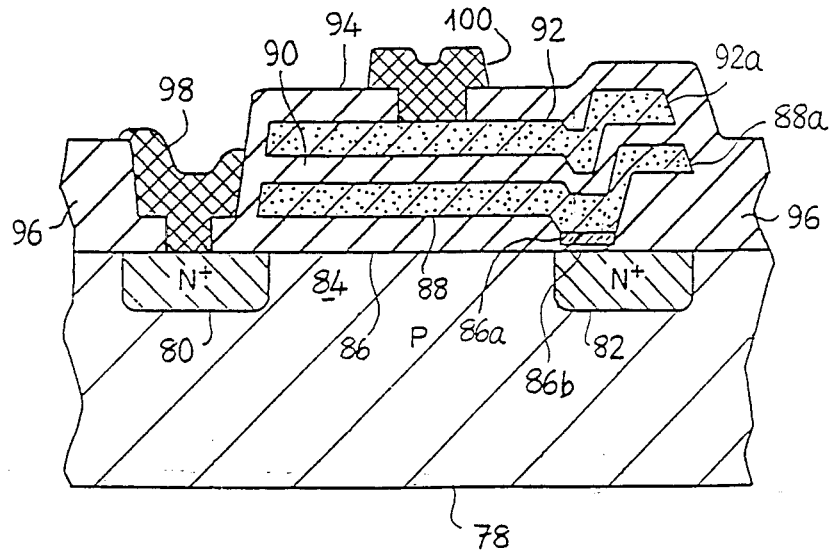
FIG. 13 is a fragmentary cross sectional view showing an example of an electrically erasable and programmable read only memory (EEPROM) device to which the present invention is applied.

FIG. 13 shows an example of an electrically erasable and programmable read only memory (EEPROM) device to which the present invention is applied on a practical basis. The shown EEPROM device comprises a p-type silicon substrate 78 having formed therein a pair of heavily-doped n⁺-type regions 80 and 82 which are spaced apart from each other to define a channel region 84 therebetween. One of these n⁺-type regions such as the region 80 forms the source region and the other region, viz., the region 82 forms the drain region of the transistor to form part of the memory device. On the channel region 84 of the substrate 78 is provided a gate oxide layer 86 of ordinary silicon dioxide which intervenes between field oxide regions 96 also formed on the silicon substrate 78. On the gate oxide layer 86 in turn is formed a floating gate region 96 of polysilicon which has a major portion located over the channel region 84 of the substrate 78 and a small portion 88a located over the drain region 82 in the substrate 78 as shown. Across an interlevel insulator oxide layer 90 formed on this floating gate region 88 is provided a control gate region 92 which has a portion 92a overlapping the portion 88a of the floating gate region 88 across a portion of the interlevel insulator oxide layer 90. The control gate region 92 in turn is covered with a toplevel insulator oxide layer 94. The gate oxide layer 86, interlevel insulator oxide layer 90 and toplevel insulator oxide layer 94 intervene between field oxide regions 96 also formed on the silicon substrate 78. In contact with the source region 80 is provided a conductor region 98 which extends through the gate oxide layer 86, and further in contact with the control gate region 92 is provided a conductor region 100 which extends through the insulator oxide layer 94 as shown.

In the EEPROM device thus configured, the gate oxide layer 86 intervening between the silicon substrate 78 and the floating gate region 88 has between the drain region 82 and the previously mentioned small portion 88a of the floating gate region 88 a first film portion 86a directly underlying the small portion 88a and a second film portion 86b directly overlying the drain region 82 as shown. The first film portion 86a is formed of the silicon-rich silicon dioxide film proposed by the present invention while the second film portion 86b intervening between the first film portion 86a and the drain region 82 is formed of pure silicon dioxide which is homogenous with the major portion of the gate oxide layer 86. The first film portion 86a may be about 300 Å thick and the second film portion 86b may be less than about 100 Å thick. The silicon-rich silicon dioxide forming the first film portion 86a is fabricated to contain silicon segregates of grain sizes controlled to provide a reduced resistance and an increased breakdown voltage. This permits formation of the gate oxide layer 86 in a manner to have an increased thickness in its entirety and to reduce the thickness of the second film portion 86b to 100 Å or even less. This will provide an enhanced tunnel effect and will thus facilitate injection and release of charges into and out of the gate oxide layer 86 therethrough, thus enabling the memory device to operate efficiently during read and write modes of operation thereof. The tunnel effect thus achievable by the silicon-rich silicon dioxide film portion 86a can be controlled by varying the grain sizes of the silicon segregates to be formed therein during fabrication of the device.

Figure 14:
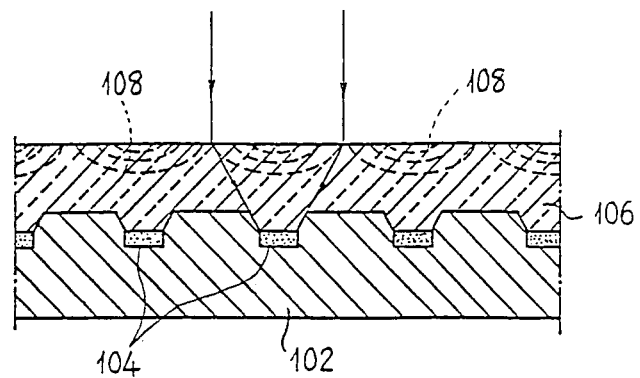
FIG. 14 is a fragmentary cross sectional view showing an example of a solid-state image sensing device to which the present invention is also applied.

In FIG. 14 is shown an example of a solid-state image sensing device to which the present invention is also applied. The device comprises a silicon substrate 102 having provided therein an array of photoelectric transducer elements 104 arranged typically in rows and columns in the substrate 102. The silicon substrate 102 is covered with a light-permeable protective layer 106 having the individual transducer elements 104 embedded between the substrate 102 and the layer 106 as shown. The protective layer 106 is constructed of pure silicon dioxide and has surface portions into which additional silicon atoms are injected to form silicon-rich silicon dioxide film regions 108 which are located respectively in registry with the transducer elements 104. The silicon-rich silicon dioxide film regions 108 thus formed in the protective layer 106 of pure silicon dioxide have an index of refraction variable with the density profile of the silicon segregates in the regions 108. Each of such film regions 108 provides the function of a condenser lens having a refractive-index profile variable with the density profile of the silicon atoms. The lens regions provided by the silicon-rich silicon dioxide film regions 108 are effective to have incoming light beams focussed onto the individual photoelectric transducer elements 104 respectively underlying the regions 108 so that the light incident on the transducer array can be efficiently collected by the array. In order to enable the film regions 108 to function effectively as condenser lenses, it is advantageous to have the additional silicon atoms injected therein such that the distribution of the silicon atoms in each region 108 is higher in its central area than in its peripheral area. The device herein shown is further advantageous for the planar configuration of the silicon oxide protective layer 106 which will provide ease of assemblage during fabrication of the device and which will contribute to increasing the mechanical strength of the device structure.

Figure 15:
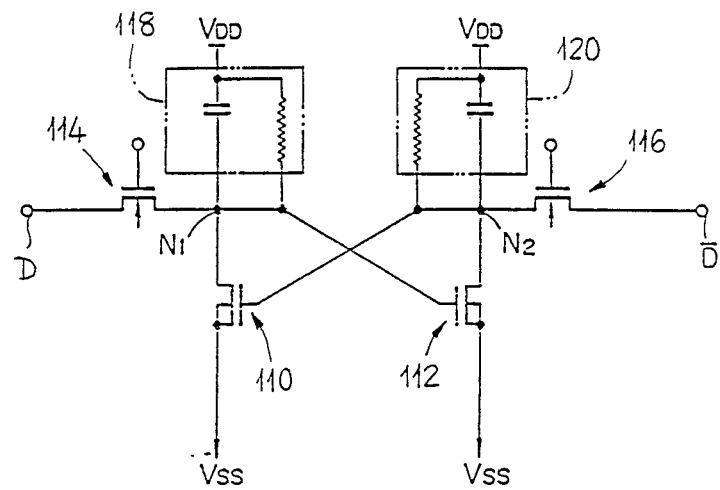
FIG. 15 is a circuit diagram showing an example of a static memory cell to which the present invention is further applied.

FIG. 15 shows an example of a static memory cell to which the present invention is further applied on a practical basis. The memory cell is assumed to be of the standard four-transistor configuration which per se is well known in the art and is shown provided between complementary bit lines D and $\overline{D}$. Such a memory cell comprises a pair of n-channel inverter transistors 110 and 112 having their sources connected to ground line $V_{SS}$ and their drains connected to the bit lines D and $\overline{D}$ through common nodes $N_1$ and $N_2$ and n-channel pass transistors 114 and 116, respectively. The common node $N_1$ interconnecting the transistors 110 and 114 together is further connected through a charge-pump capacitor 118 to an input terminal for a supply voltage $V_{DD}$ and to the gate of the inverter transistor 112. In a like manner, the common node $N_2$ interconnecting the transistors 112 and 116 together is further connected through a charge-pump capacitor 120 to the input terminal for the supply voltage $V_{DD}$ and to the gate of the inverter transistor 110. Each of the charge-pump capacitors 118 and 120 is constructed of a highly dielectric film.

It is now assumed that the memory cell thus constructed is held in a condition having one inverter transistor 110 in non-conduction state and the other inverter transistor 112 in conduction state. If it happens under such a condition that an alpha particle is incident on, for example, the conductor region forming the common node $N_1$, the negative charges which have been accumulated on the particular conductor region would be destroyed or critically damaged. In such an occasion, the negative charges which have been stored in the associated capacitor 118 are immediately released to compensate for the charges destroyed and enable the inverter transistor 112 to stay in the conduction state. The voltage at the node $N_1$ may be caused to temporarily drop in response to the bombardment of the alpha particle but will thus restore the initial level instantaneously after the voltage drop.

In the static memory cell of the described configuration, the highly dielectric film forming each of the charge-pump capacitors 118 and 120 is provided by a silicon-rich silicon dioxide fabricated to provide a high dielectric dielectric constant. Such a capacitor is adapted to achieve both a conductance which can afford to produce a current substantially equal to the leak current through each of the inverter transistors 110 and 112 and a capacitance which can afford to compensate for the fluctuations of voltage at each of the nodes $N_1$ and $N_2$ which would be produced by incoming noises.

While various important aspects of the present invention have been hereinbefore described in detail, such aspects are merely illustrative of the gist of the present invention may therefore be changed and/or modified in numerous respects and in numerous manners where desired. The grain sizes and the density profile of the additional silicon atoms to be injected into the silicon dioxide film may be varied depending upon the application for which the film is to be used. While, in addition, various examples of the devices each using the silicon-rich silicon dioxide film according to the present invention have been described and shown, it should be borne in mind that such examples are merely among a number of possible practical applications which the silicon dioxide film may find in the art of semiconductor technology. Such practical applications of the silicon dioxide film according to the present invention may include, in addition to those described hereinbefore, an optical filter and an optical beam attenuator to exploit the property of the silicon-rich silicon dioxide film in which the silicon atoms contained therein form centers of reflection. For such applications, the silicon dioxide film may be fabricated to contain silicon segregates of relatively large grain sizes with a view to facilitating the film to transmit beams of light with relatively short wavelengths. Alternatively, the silicon dioxide film may be fabricated to contain silicon segregates of relatively small grain sizes to facilitate the film to reflect beams of light with relatively short wavelengths. The light transmissivity of the silicon dioxide film can thus be varied by controlling the grain sizes of the silicon segregates to be injected into the film.

What is claimed is:

1. A method of producing silicon-rich silicon dioxide film comprising the steps of:
   (a) forming a silicon dioxide film,
   (b) injecting silicon ions into the silicon dioxide film by ion implantation with an ion acceleration energy between about 20 keV and 50 keV and an ion dose between about $1 \times 10^{16}$ and $8 \times 10^{16}$ atoms/cm$^2$, and
   (c) annealing the resultant silicon dioxide film at a temperature between about 900° C. and 1100° C. for a time between about 20 and 40 minutes to cause the additional silicon atoms in the silicon dioxide film to form segregates of silicon therein.

* * * * *